(12) United States Patent
Nagano et al.

(10) Patent No.: US 6,573,111 B2
(45) Date of Patent: Jun. 3, 2003

(54) METHOD OF MAKING A SEMICONDUCTOR DEVICE WITH CAPACITOR ELEMENT

(75) Inventors: Yoshihisa Nagano, Suita (JP); Yasuhiro Uemoto, Otsu (JP); Yuji Judai, Uji (JP); Masamichi Azuma, Otsu (JP); Eiji Fujii, Ibaraki (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 10/177,781

(22) Filed: Jun. 20, 2002

(65) Prior Publication Data

US 2002/0155663 A1 Oct. 24, 2002

Related U.S. Application Data

(62) Division of application No. 09/190,906, filed on Nov. 12, 1998.

(30) Foreign Application Priority Data

Nov. 13, 1997 (JP) ............................................. 9-311745

(51) Int. Cl.$^7$ ...................... H01L 21/00; H01L 21/8242
(52) U.S. Cl. ............................ 438/3; 438/253; 438/396
(58) Field of Search ............................. 438/3, 250–256, 438/393–399

(56) References Cited

U.S. PATENT DOCUMENTS

| | | |
|---|---|---|
| 5,027,185 A | 6/1991 | Liauh |
| 5,053,917 A | 10/1991 | Miyasaka et al. |
| 5,475,248 A | 12/1995 | Takenaka |
| 5,566,045 A | 10/1996 | Summerfelt et al. |
| 5,648,673 A | 7/1997 | Yasuda |
| 5,883,418 A | 3/1999 | Kimura |

FOREIGN PATENT DOCUMENTS

| | | |
|---|---|---|
| EP | 0 503 078 | 9/1992 |
| EP | 0 690 507 | 1/1996 |
| EP | 0 697 717 | 2/1996 |
| EP | 0 720 213 | 7/1996 |
| EP | 0 731 503 | 9/1996 |
| EP | 0 753 764 | 1/1997 |
| KR | 9505259 | 5/1995 |

OTHER PUBLICATIONS

European Search Report for EP 98 12 1156 dated Feb. 26, 1999.
"VLSI Technology, Second Edition", Mc Graw–Hill International Editions XP–002092408, pp. 378–385, 1988.

Primary Examiner—John F. Niebling
Assistant Examiner—Jennifer M. Kennedy
(74) Attorney, Agent, or Firm—RatnerPrestia

(57) ABSTRACT

A semiconductor device includes: a silicon substrate; a MOS semiconductor device provided on the silicon substrate, the MOS semiconductor device including a silicide region on an outermost surface thereof; a first insulating film covering the MOS semiconductor device; a capacitor element provided on the first insulating film, the capacitor element comprising a lower electrode, an upper electrode, and a capacitor film interposed between the lower electrode and the upper electrode, and the capacitor film comprising a ferroelectric material; a second insulating film covering the first insulating film and the capacitor element; a contact hole provided in the first insulating film and the second insulating film over the MOS semiconductor device and the capacitor element; and an interconnection layer provided on the second insulating film for electrically connecting the MOS semiconductor device and the capacitor element to each other, wherein a bottom portion of the interconnection layer comprises a conductive material other than titanium.

4 Claims, 5 Drawing Sheets

METHOD OF MAKING A SEMICONDUCTOR DEVICE WITH CAPACITOR ELEMENT

This application is a divisional of U.S. patent application Ser. No. 09/190,906 filed Nov. 12, 1998.

BACKGROUND OF THE INVENTION

1. Field of the Invention

The present invention relates to a semiconductor device having a MOS semiconductor device and a capacitor element which includes a capacitor film of a high dielectric material having a high dielectric constant or a ferroelectric material.

2. Description of the Related Art

A conventional semiconductor device 1000 and a method for producing the same will now be described.

FIG. 5 is a cross-sectional view illustrating the semiconductor device 1000.

Referring to FIG. 5, a CMOS transistor 5 is formed on a silicon substrate 1. The CMOS transistor 5 includes source and drain regions 2 and 3, a gate insulating film 44, and a gate 4. The source and drain regions 2 and 3 and the gate 4 are each formed of silicon. A first insulating film 7 is formed over an oxide film 6 (which is formed on the silicon substrate 1) and the CMOS transistor 5. The first insulating film 7 has a layered structure including a silicon oxide film and a silicon nitride film.

A capacitor element 11 is formed in a predetermined location on the first insulating film 7. The capacitor element 11 includes a lower electrode 8 and an upper electrode 9, which are each formed of a platinum film, and a capacitor film 10 which is formed of an insulative metal oxide and is positioned between the lower electrode 8 and the upper electrode 9. Platinum is employed as a material for the lower electrode 8 and the upper electrode 9, because platinum does not react with the metal oxide contained in the capacitor film 10 even during a heat treatment and has a superior heat resistance.

A second insulating film 12 formed of a silicon oxide film is provided over the first insulating film 7 and the capacitor element 11. Contact holes 13 are provided through the second insulating film 12 to the lower electrode 8 and the upper electrode 9. Moreover, contact holes 14 are provided through the first insulating film 7 and the second insulating film 12 to the source and drain regions 2 and 3. Although not shown in the drawing, another contact hole is provided to reach the gate 4.

The CMOS transistor 5 and the capacitor element 11 are connected to each other by an interconnection layer 15. The interconnection layer 15 is a multilayer film including a titanium layer, a titanium nitride layer, an aluminum layer and another titanium nitride layer in this order from the silicon substrate 1. In the interconnection layer 15, the titanium layer is provided closest to the silicon substrate 1, or the CMOS transistor 5, so as to allow titanium to diffuse into surfaces of the source and drain regions 2 and 3 and the gate 4 of the CMOS transistor 5, thereby forming a low-resistance silicide in the surfaces.

Next, a method for producing the conventional semiconductor device 1000 will be described.

FIGS. 6A to 6E each illustrate a production step for producing the conventional semiconductor device 1000.

First, as illustrated in FIG. 6A, the CMOS transistor 5 including the source and drain regions 2 and 3 and the gate 4 which are each formed of silicon are formed on the silicon substrate 1. The gate 4 is actually provided over the gate insulating film 44. Next, as illustrated in FIG. 6B, the first insulating film 7 is formed over the CMOS transistor 5 and the oxide film 6 which is formed on the silicon substrate 1. A first platinum layer 8a, a ferroelectric film 10a, and a second platinum layer 9a are formed in this order on the first insulating film 7. Then, the first platinum layer 8a, the ferroelectric film 10a, and the second platinum layer 9a are selectively etched to provide the capacitor element 11 having the lower electrode 8, the capacitor film 10 and the upper electrode 9, as illustrated in FIG. 6C.

Next, as illustrated in FIG. 6D, the second insulating film 12 is formed to cover the first insulating film 7 and the capacitor element 11, and the contact holes 13 are formed through the second insulating film 12 to the lower electrode 8 and the upper electrode 9. Moreover, the contact holes 14 are formed through the second insulating film 12 and the first insulating film 7 to the source and drain regions 2 and 3 of the CMOS transistor 5. Although not shown in the drawing, another contact hole is provided to reach the gate 4.

Finally, as illustrated in FIG. 6E, in order to electrically connect the CMOS transistor 5, the capacitor element 11 and other semiconductor elements (not shown) to one another, a titanium film, a titanium nitride film, an aluminum film and another titanium nitride film are formed in this order across the entire substrate, and this four-layer film is then selectively etched to form the interconnection layer 15. Although not shown in the drawing, the interconnection layer 15 is also connected to the gate 4. Subsequent processes are performed by an ordinary method to complete the semiconductor device 1000.

SUMMARY OF THE INVENTION

A semiconductor device of the invention includes: a silicon substrate; a MOS semiconductor device provided on the silicon substrate, the MOS semiconductor device including a silicide region on an outermost surface thereof; a first insulating film covering the MOS semiconductor device; a capacitor element provided on the first insulating film, the capacitor element including a lower electrode, an upper electrode, and a capacitor film interposed between the lower, electrode and the upper electrode, and the capacitor film including a ferroelectric material; a second insulating film covering the first insulating film and the capacitor element; a contact hole provided in the first insulating film and the second insulating film over the MOS semiconductor device and the capacitor element; and an interconnection layer provided on the second insulating film for electrically connecting the MOS semiconductor device and the capacitor element to each other, wherein a bottom portion of the interconnection layer includes a conductive material other than titanium.

The silicide region may include one of a titanium silicide, a cobalt silicide, a chromium silicide, a molybdenum silicide, a tungsten silicide, a tantalum silicide, a palladium silicide, a platinum silicide, a vanadium silicide, and a zirconium silicide.

The interconnection layer may include one of a multilayer structure including a titanium nitride layer, an aluminum layer and a titanium nitride layer in this order from the silicon substrate; a multilayer structure including a tungsten nitride layer, an aluminum layer and a titanium nitride layer in this order from the silicon substrate; a multilayer structure including a tantalum nitride layer, an aluminum layer and a titanium nitride layer in this order from the silicon substrate; and a multilayer structure including a tungsten nitride layer, an aluminum layer and a titanium nitride layer in this order from the silicon substrate.

The upper electrode may include an iridium oxide layer.

Thus, the invention described herein makes possible the advantage of providing a semiconductor device in which a MOS semiconductor element and a capacitor element are electrically connected to each other with a low electric resistance therebetween using an interconnection layer without providing titanium in a bottom portion of the interconnection layer, thereby preventing deterioration of the characteristics of the capacitor element.

This and other advantages of the present invention will become apparent to those skilled in the art upon reading and understanding the following detailed description with reference to the accompanying figures.

DESCRIPTION OF THE PREFERRED EMBODIMENTS

Figure 1:
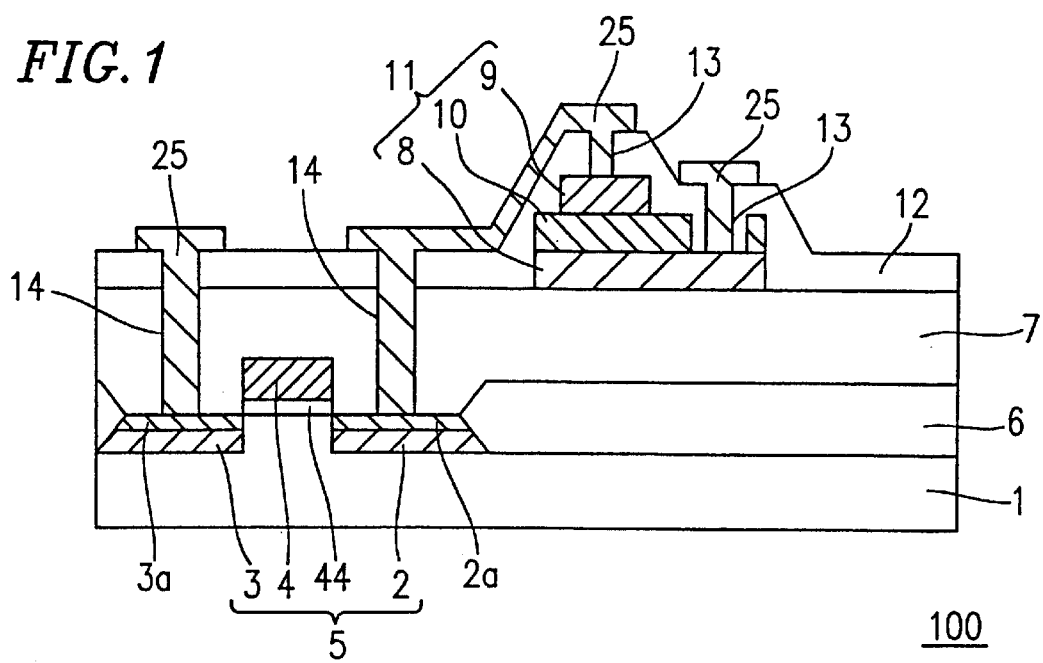
FIG. 1 is a cross-sectional view illustrating a semiconductor device according to an example of the present invention.

The entire disclosure of U.S. patent application Ser. No. 09/190,906 filed Nov. 12, 1998, is expressly incorporated by reference herein.

In the aforementioned conventional semiconductor device 1000, the upper electrode 9 of a platinum film is normally formed by sputtering, whereby the upper electrode 9 has a columnar crystalline structure. After the interconnection layer 15 is formed, the semiconductor device 1000 is typically subjected to a heat treatment in order to improve the characteristics of the capacitor element 11 and to obtain a good contact resistance between the CMOS transistor 5 and the interconnection layer 15.

In such a process, however, the inventors of the present invention have discovered that, due to this heat treatment, titanium in the interconnection layer 15 tends to diffuse through grain boundaries of the columnar crystalline structure of the platinum film into the capacitor film 10, thereby reacting with the capacitor film 10. This deteriorates the characteristics of the capacitor element 11.

The present invention has been achieved so as to overcome the above-mentioned disadvantage, which was newly confirmed by the present inventors in the course of the invention, involved in the conventional art.

An example of the present invention will now be described with reference to FIGS. 1 to 4E.

FIG. 1 is a cross-sectional view illustrating a semiconductor device 100 according to an example of the present invention.

Referring to FIG. 1, the CMOS transistor 5 is formed on the silicon substrate 1. The CMOS transistor 5 includes the source and drain regions 2 and 3, the gate insulating film 44, and the gate 4. Unlike the CMOS transistor 5 of the conventional semiconductor device 1000, low-resistance titanium silicide regions 2a and 3a are formed on surfaces of the source and drain regions 2 and 3, respectively, in a self-aligning manner. Another silicide region may be formed on a surface of the gate 4.

The first insulating film 7 is formed over the oxide film 6, which is formed on the silicon substrate 1, and the CMOS transistor 5. The first insulating film 7 has a layered structure including a silicon oxide film and a silicon nitride film. The capacitor element 11 is formed in a predetermined location on the first insulating film 7. The capacitor element 11 includes the lower electrode 8, the upper electrode 9, and the capacitor film 10 which is formed of an insulative metal oxide and is positioned between the lower electrode 8 and the upper electrode 9. Preferably, the lower electrode 8 and the upper electrode 9 are formed of a platinum film, because platinum does not react with the metal oxide contained in the capacitor film 10 even during a heat treatment and has a superior heat resistance.

As a ferroelectric material of the capacitor film 10, an insulative metal oxide having a bismuth layered perovskite structure may be used, for example. While lead zirconate titanate, barium titanate, or the like, are commonly used as the ferroelectric material, the above-mentioned ferroelectric material having the bismuth layered perovskite structure is much superior to the others in terms of the charge retaining property and the polarization inverting property. Thus, by using such a ferroelectric material, it is possible to produce a high-performance memory device.

The second insulating film 12 formed of a silicon oxide film is provided over the first insulating film 7 and the capacitor element 11. The contact holes 13 are provided through the second insulating film 12 to the lower electrode 8 and the upper electrode 9. The contact holes 14 are provided through the first insulating film 7 and the second insulating film 12 to the source and drain regions 2 and 3.

The CMOS transistor 5 and the capacitor element 11 are connected to each other by an interconnection layer 25. The interconnection layer 25 is a multilayer film including a titanium nitride layer, an aluminum layer and another titanium nitride layer in this order from the silicon substrate 1.

Since the outermost surfaces of the source and drain regions 2 and 3 of the CMOS transistor 5 are formed of a silicide, there is provided a good electric contact between the interconnection layer 25 and the CMOS transistor 5 without using titanium in a bottom portion of the interconnection layer 25. In the conventional art, it is necessary to provide a titanium layer at the bottom of the interconnection layer 15 in order to allow titanium to diffuse into silicon so as to provide a silicide region. In contrast, there is no need to provide titanium at the bottom of the interconnection layer 25 for such a purpose in the above-mentioned semiconductor device 100 of the present invention. This is advantageous in that it is possible to prevent deterioration of the characteristics of the capacitor film 10 otherwise caused due to titanium diffusion through the upper electrode 9 into the capacitor film 10.

Furthermore, the silicide regions 2a and 3a can be stably obtained in the designed configuration since diffusion process is not involved.

Figure 2:
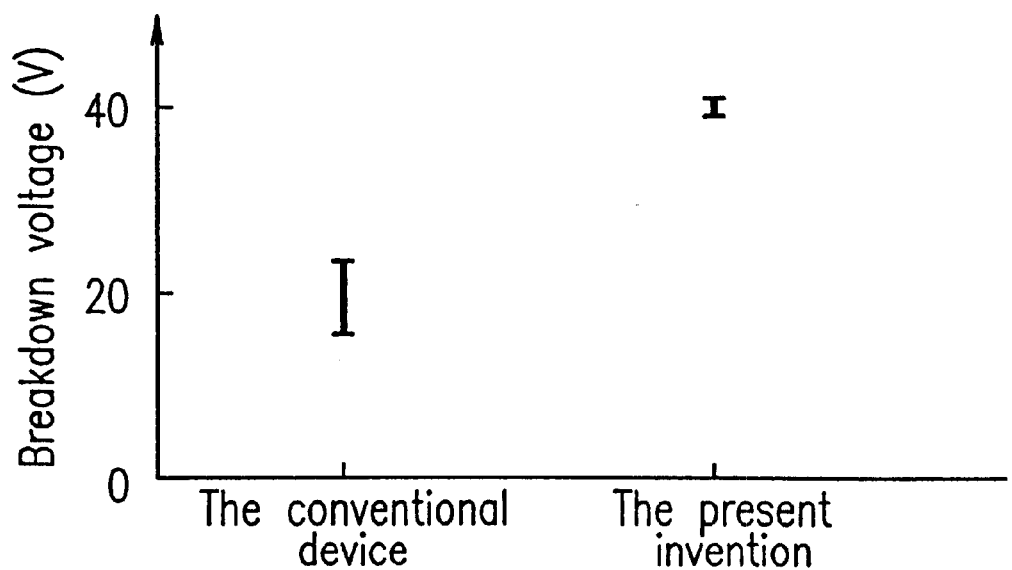
FIG. 2 is a graph showing the breakdown voltage of a conventional semiconductor device and that of the semiconductor device according to the example of the present invention.

FIG. 2 is a graph showing the breakdown voltage of the conventional semiconductor device 1000 and that of the semiconductor device 100 according to the example of the present invention. As is apparent from FIG. 2, the present invention improves the breakdown voltage of the semiconductor device from about 20 V to about 40 V (about 2-fold improvement).

Figure 3:
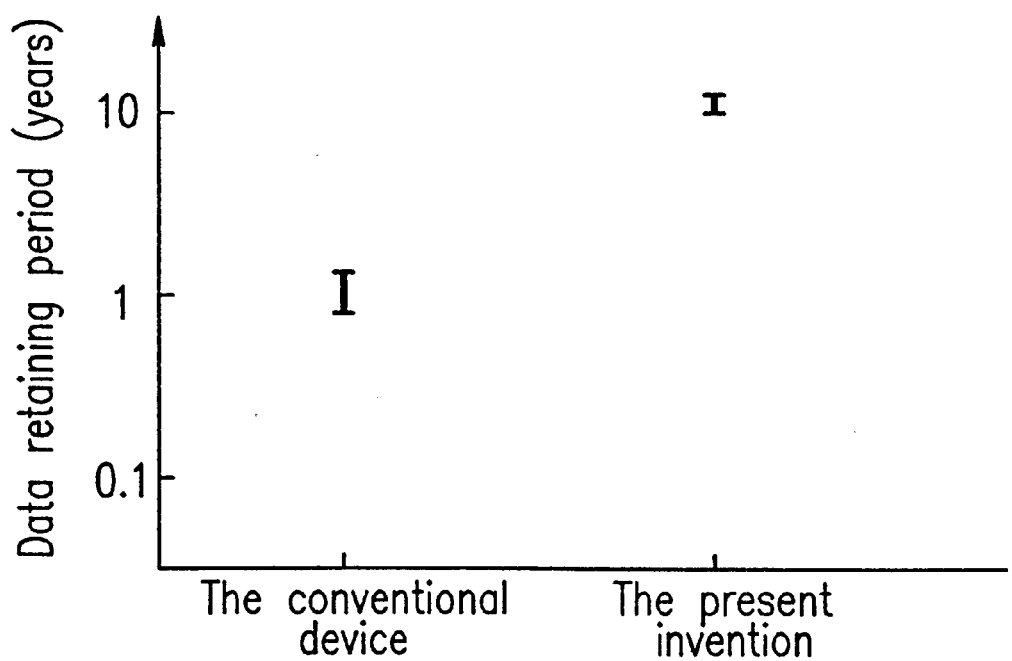
FIG. 3 is a graph showing the data retaining period of the conventional semiconductor device and that of the semiconductor device according to the example of the present invention.

FIG. 3 is a graph showing the data retaining period of the conventional semiconductor device 1000 and that of the semiconductor device 100 according to the example of the present invention. As is apparent from FIG. 3, the present invention improves the data retaining period of the semiconductor device from about 1 year to about 10 years (about 10-fold improvement).

Now, a method for producing the semiconductor device 100 according to the example of the present invention will be described.

FIGS. 4A to 4E each illustrate a production step for producing the semiconductor device 100.

Figure 4A:
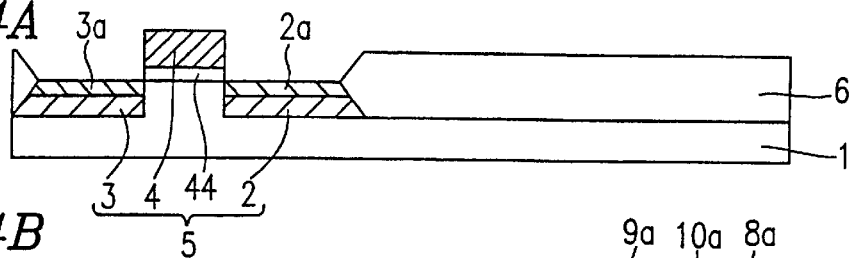
FIGS. 4A to 4E illustrate production steps for producing the semiconductor device according to the example of the present invention.

First, as illustrated in FIG. 4A, the CMOS transistor 5 is formed on the silicon substrate 1. The CMOS transistor 5 includes the source and drain regions 2 and 3 and the gate 4 whose respective outermost surfaces are silicon. The gate 4 is actually formed on the gate insulating film 44, for example, formed of a silicon oxide layer. Then, the low-resistance titanium silicide regions 2a and 3a are formed on surfaces of the source and drain regions 2 and 3, respectively, in a self-aligning manner. The silicide regions 2a and 3a each has a thickness typically in the range of about 40 nm to about 80 nm, for example, of about 50 nm.

Figure 4B:
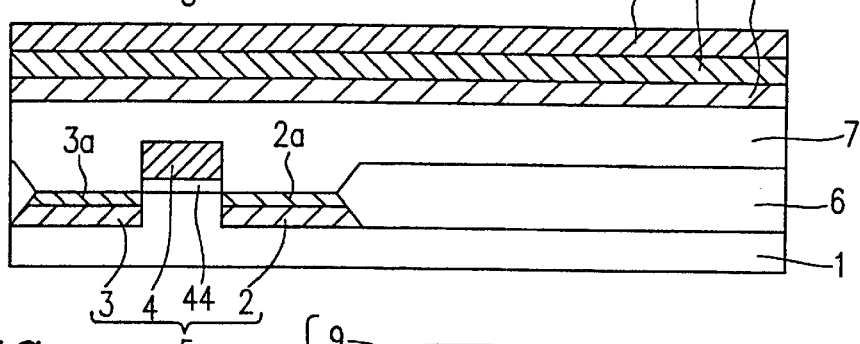
Figure 4C:
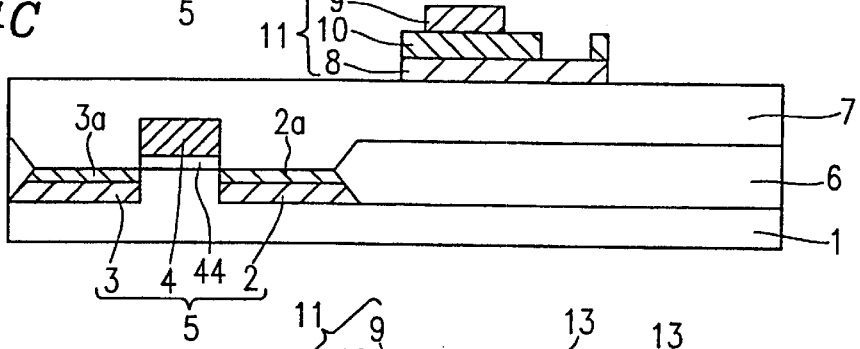

Next, as illustrated in FIG. 4B, the first insulating film 7 is formed over the CMOS transistor 5 and the oxide film 6 which is formed on the silicon substrate 1. The first platinum layer 8a, the ferroelectric film 10a and the second platinum layer 9a are formed in this order on the first insulating film 7. Then, the first platinum layer 8a, the ferroelectric film 10a and the second platinum layer 9a are selectively etched to provide the capacitor element 11 having the lower electrode 8, the capacitor film 10 and the upper electrode 9, as illustrated in FIG. 4C.

Figure 4D:
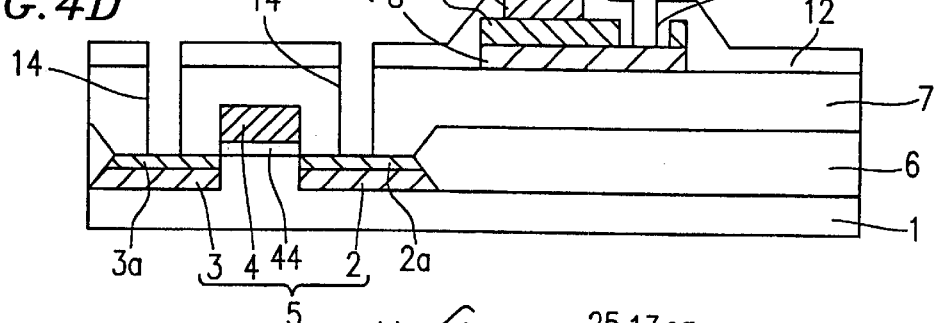

Next, as illustrated in FIG. 4D, the second insulating film 12 is formed to cover the first insulating film 7 and the capacitor element 11. Then, the contact holes 13 are formed through the second insulating film 12 to the lower electrode 8 and the upper electrode 9. Moreover, the contact holes 14 are formed through the second insulating film 12 and the first insulating film 7 to the source and drain regions 2 and 3 of the CMOS transistor 5.

Figure 4E:
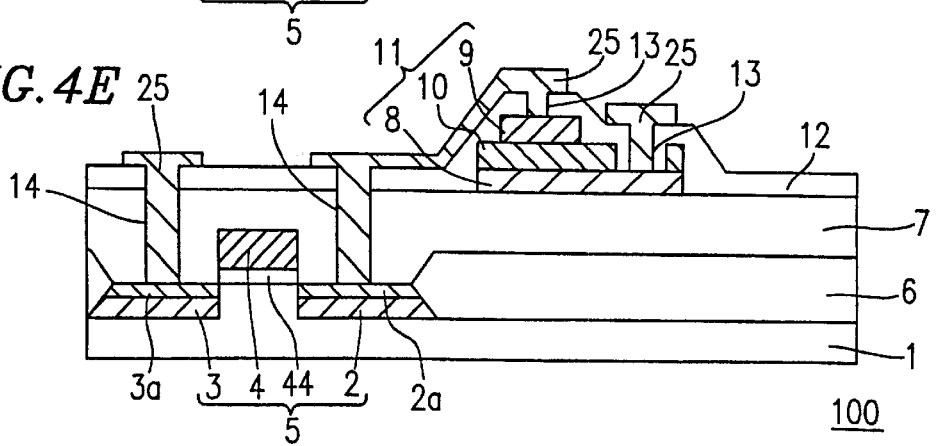
Figure 5:
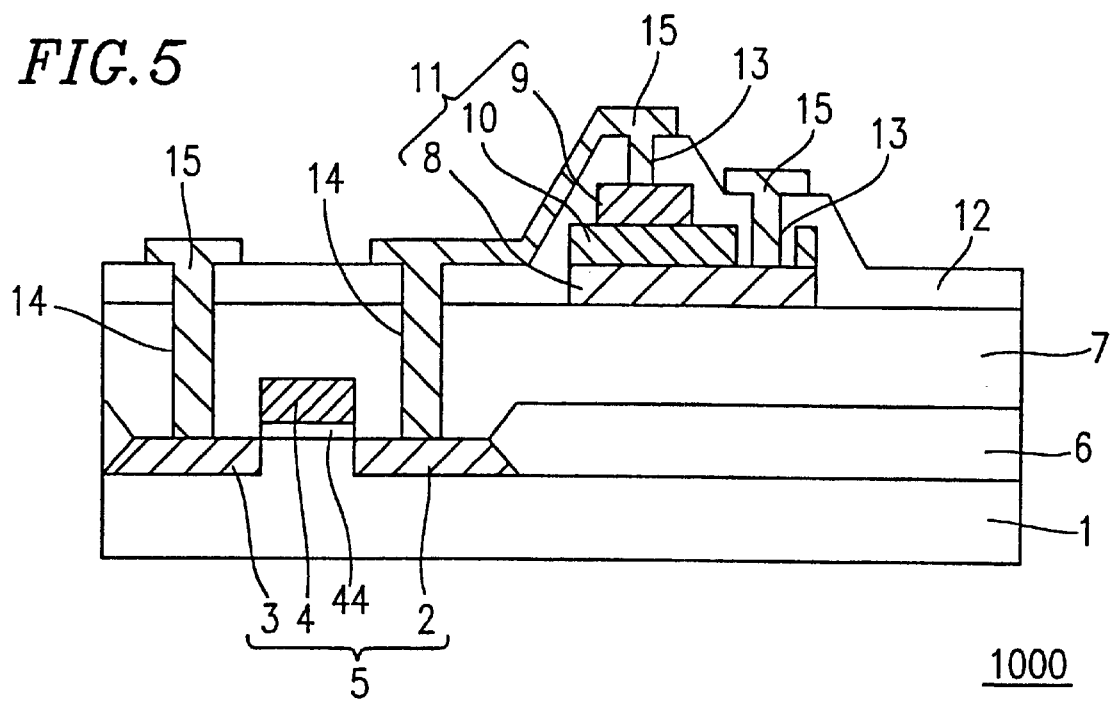
FIG. 5 is a cross-sectional view illustrating the conventional semiconductor device.
Figure 6A:
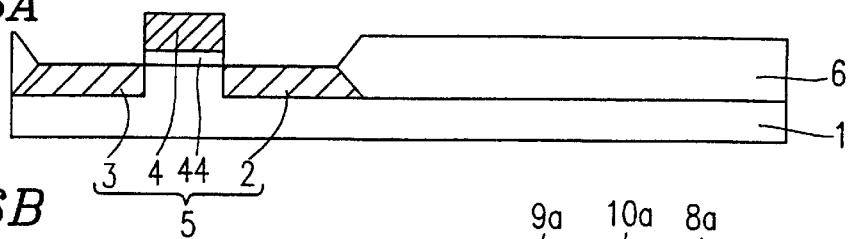
FIGS. 6A to 6E illustrate production steps for producing the conventional semiconductor device.
Figure 6B:
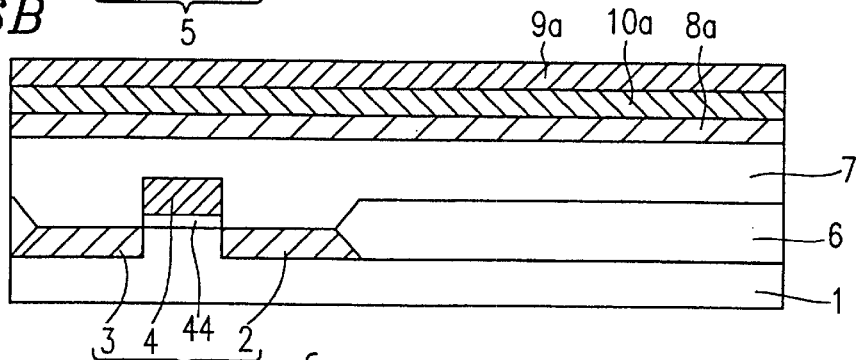
Figure 6C:
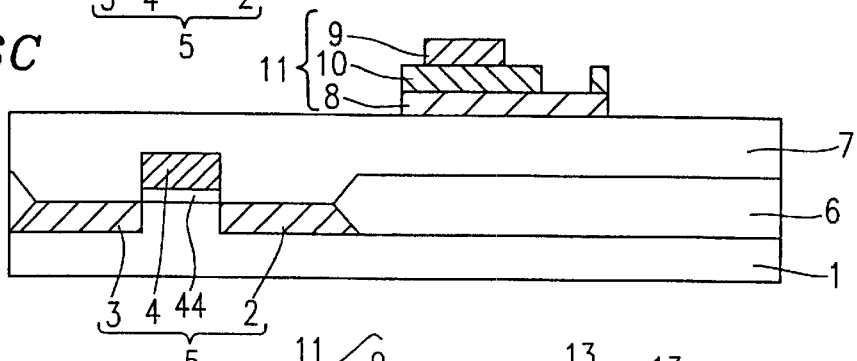
Figure 6D:
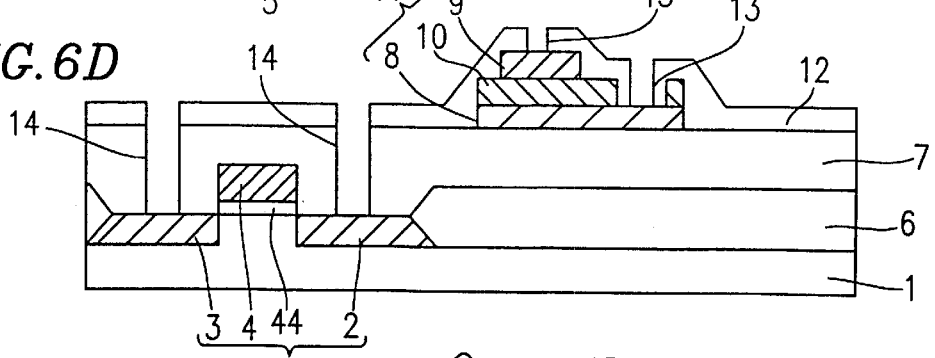
Figure 6E:
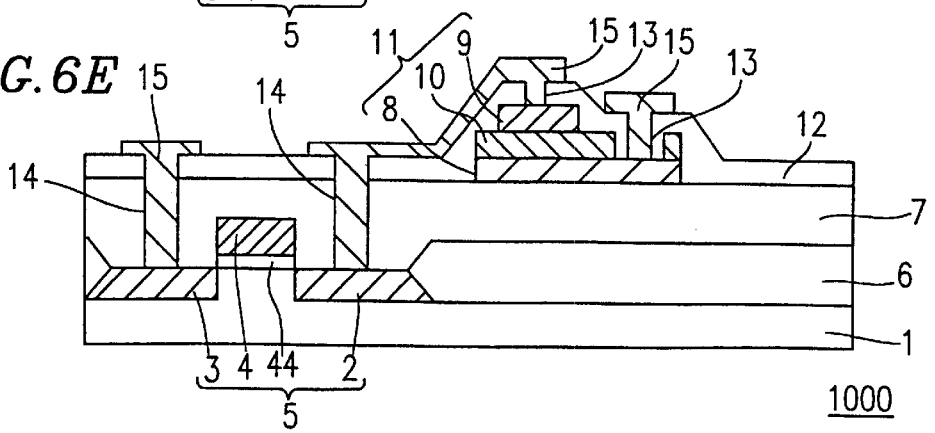

Finally, as illustrated in FIG. 4E, in order to electrically connect the CMOS transistor 5, the capacitor element 11 and other semiconductor elements (not shown) to one another, a titanium nitride film, an aluminum film and another titanium nitride film are formed in this order from the silicon substrate 1 across the entire substrate, and this three-layer film is then selectively etched to form the interconnection layer 25. Subsequent processes are performed by an ordinary method to complete the semiconductor device 100.

Although not shown in the drawings, the interconnection layer 25 may be provided so as to be also connected to the gate 4, for example, via a further contact hole.

The interconnection layer 25 may be: a multilayer film including a tungsten nitride layer, an aluminum layer and a titanium nitride layer in this order from the silicon substrate 1; a multilayer film including a tantalum nitride layer, an aluminum layer and a titanium nitride layer in this order from the silicon substrate 1; or a multilayer film including a tungsten nitride layer, an aluminum layer and a titanium nitride layer in this order from the silicon substrate 1.

The titanium silicide regions 2a and 3a may alternatively be formed of a cobalt silicide, a chromium silicide, a molybdenum silicide, a tungsten silicide, a tantalum silicide, a palladium silicide, a platinum silicide, a vanadium silicide, or a zirconium silicide.

Furthermore, as mentioned previously, another silicide region may be formed on the surface of the gate 4.

The lower electrode 8 and the upper electrode 9 of the capacitor element 11 may be formed of different material, or using different layered structure, from each other. Furthermore, at least one of the upper electrode 9 and the lower electrode 8, for example, the upper electrode 9, may contain iridium oxide. An iridium layer may be contained in these electorodes 8 and 9.

In order to form the respective layers in the above-mentioned structure of the semiconductor device 100, or to perform etching, any appropriate process known in the art can be employed.

While a semiconductor device incorporating a CMOS transistor is described in the above example, it should be appreciated that an ordinary MOS transistor may alternatively be used.

As described above, in the semiconductor device of the present invention, titanium is not used in a bottom portion of the interconnection layer, whereby it is possible to prevent deterioration of the characteristics of the capacitor film otherwise caused due to titanium diffusion into the capacitor film. Thus, it is possible to obtain a semiconductor device with a capacitor element having superior characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device comprising sequentially the steps of:

forming a MOS semiconductor device on a silicon substrate, the MOS semiconductor device including a silicide layer;

after forming the silicide layer, forming a first insulating film covering the MOS semiconductor device;

forming a capacitor element on the first insulating film, the capacitor element comprising a lower electrode, an upper electrode, and a capacitor film interposed between the lower electrode and the upper electrode, and the capacitor film comprising a ferroelectric material;

forming a second insulating film covering the first insulating film and the capacitor element;

forming contact holes through the first insulating film and the second insulating film over the MOS semiconductor device and the capacitor element; and forming an interconnection layer on the second insulating film for electrically connecting the MOS semiconductor device and the capacitor element to each other, wherein a bottom portion of the interconnection layer comprises a conductive material other than titanium.

2. A method according to claim 1, wherein the silicide layer comprises one of a titanium silicide, a cobalt silicide, a chromium silicide, a molybdenum silicide, a tungsten silicide, a tantalum silicide, a palladium silicide, a platinum silicide, a vanadium silicide, and a zirconium silicide.

3. A method according to claim 1, wherein the interconnection layer comprises one of a multilayer structure including a titanium nitride layer, an aluminum layer and a titanium nitride layer in this order from the silicon substrate; a multilayer structure including a tungsten nitride layer, an aluminum layer and a titanium nitride layer in this order from the silicon substrate; a multilayer structure including a tantalum nitride layer, an aluminum layer and a titanium nitride layer in this order from the silicon substrate; and a multilayer structure including a tungsten nitride layer, an aluminum layer and a titanium nitride layer in this order from the silicon substrate.

4. A method according to claim 1, wherein the upper electrode comprises an iridium oxide layer.

* * * * *